(12) United States Patent
Lerch et al.

(10) Patent No.: US 6,809,011 B2
(45) Date of Patent: Oct. 26, 2004

(54) ADJUSTING OF DEFECT PROFILES IN CRYSTAL OR CRYSTALLINE-LIKE STRUCTURES

(75) Inventors: Wilfried Lerch, Dornstadt (DE); Jürgen Niess, Sontheim (DE)

(73) Assignee: Mattson Thermal Products GmbH (DE)

( * ) Notice: Subject to any disclaimer, the term of this patent is extended or adjusted under 35 U.S.C. 154(b) by 0 days.

(21) Appl. No.: 10/276,767

(22) PCT Filed: May 16, 2001

(86) PCT No.: PCT/EP01/05537
§ 371 (c)(1),
(2), (4) Date: Nov. 18, 2002

(87) PCT Pub. No.: WO01/88974
PCT Pub. Date: Nov. 22, 2001

(65) Prior Publication Data
US 2003/0134492 A1 Jul. 17, 2003

(30) Foreign Application Priority Data
May 18, 2000 (DE) .......................................... 100 24 710

(51) Int. Cl.$^7$ ............................................. H01L 21/322
(52) U.S. Cl. ........................ 438/471; 438/473; 438/476; 438/928
(58) Field of Search ................................. 438/471, 473, 438/474, 475, 542, 543, 544, 549, 550, 799, 922, 928, 476

(56) References Cited

U.S. PATENT DOCUMENTS

| | | | |
|---|---|---|---|
| 4,962,049 A | * | 10/1990 | Chang et al. ............... 438/771 |
| 5,130,260 A | * | 7/1992 | Suga et al. ................. 438/472 |
| 5,401,669 A | | 3/1995 | Falster et al. |
| 5,403,406 A | | 4/1995 | Falster et al. |
| 5,445,975 A | | 8/1995 | Gardner et al. |
| 5,574,307 A | | 11/1996 | Kageyama et al. |
| 5,882,989 A | * | 3/1999 | Falster ....................... 438/473 |
| 5,884,412 A | | 3/1999 | Tietz et al. |

FOREIGN PATENT DOCUMENTS

| | | |
|---|---|---|
| DE | 19847101 | 5/2000 |
| EP | 0573707 | 12/1993 |
| EP | 0743377 | 11/1996 |
| EP | 0908958 | 4/1999 |
| EP | 0965662 | 12/1999 |
| JP | 04064221 | 2/1992 |
| WO | WO 98/01890 | 1/1998 |
| WO | WO 00/13226 | 3/2000 |
| WO | WO 00/67299 | 11/2000 |

OTHER PUBLICATIONS

XP-000925112, Electrochemical Society Proceedings vol. 98013.

* cited by examiner

Primary Examiner—Kevin M. Picardat
(74) Attorney, Agent, or Firm—R W Becker & Associates; R W Becker

(57) ABSTRACT

The invention relates to a method for generating defect profiles in a crystal or crystalline structure of a substrate, preferably a semiconductor, during a thermal treatment in a process chamber. According to the inventive method, a concentration and/or a density distribution of defects is controlled with at least one reactive component each depending on at least two process gases that differ in their composition. At least two of the process gases independently act upon at least two different surfaces of the substrate.

54 Claims, 3 Drawing Sheets

ADJUSTING OF DEFECT PROFILES IN CRYSTAL OR CRYSTALLINE-LIKE STRUCTURES

BACKGROUND OF THE INVENTION

The following invention relates to a method of producing defect profiles in a crystalline or crystalline-like structure, preferably in a semiconductor, during a thermal treatment in a process chamber.

During the manufacture of semiconductor components, for example based on silicon, it is known, by thermal treatment steps of the semiconductor in a suitable process gas environment, to influence the distribution of foreign atoms introduced (implanted) in the semiconductor or to influence the distribution of crystal defects. In general, the distribution of foreign atoms is essentially codetermined by the distribution of the defects.

For example, it is known from W. Lerch et al.; Mat. Res. Soc. Symp. Proc. (1998), Vol 525, pp 237–255 and D. F. Downey et al.: Mat Res. Soc. Symp. Proc. (1998), Vol 525, pp. 263–271, that by means of an oxygen-containing process gas at a constant thermal stressing of an implanted or doped silicon semiconductor, the doping profile of boron can be influenced, since the oxidation of silicon leads to an over saturation of self-interstitial atoms (EZG, a type of point defects with which Si atoms are disposed on interstitial positions), the concentration of which influences the diffusion property of the boron and thus the doping profile of boron.

With an oxygen-containing process gas environment during the thermal treatment of semiconductors, essentially only those foreign atom profiles or doping profiles can be influenced, the foreign atoms of which essentially reach a lattice position via the kick-out mechanism. In so doing, the foreign atom previously disposed in the interstitial region reaches a lattice position, whereby a silicon atom (or in general lattice atom) is given off from this lattice position into an interstitial position.

U.S. Pat. Nos. 5,401,669 and 5,403,406 describe a selective formation of defects via a nitrogen-containing process gas atmosphere, whereby these defects serve as nucleation centers for the precipitation of oxygen dissolved in silicon.

D. F. Downey et al.; Mat. Res. Soc. Symp. Proc. (1997), Vol 470, pp. 299–311 describes a reactive process gas during the rapid thermal treatment (RTP: Rapid Thermal Processing) of doped silicon wafers with regard to the doping profile for various reactive gases of different concentrations.

In the not yet published German application 199 27 962 of the applicant there is presented a method for the adjustment of the doping profile that is improved relative to D. F. Downey et al. (Mat. Res. Soc. Symp. Proc. (1997) Vol 470, pp 299–311). In this case, a semiconductor is essentially subjected to a rapid thermal treatment (in an RTP system) in a process gas atmosphere that includes a number of reactive gases in order, for example, via these reactive gases, to activate different inherent or self-point defects simultaneously and in different concentrations. In general, defect concentration and/or their spatial defect distributions, and hence also the distribution(s) of the activated doping atoms, can be controlled by the described method.

With the increasingly smaller structure sizes of semiconductor components, the requirements also increase with regard to the possibilities of the control of defect and doping profiles (here in the sense of the spatial distribution of activated foreign atoms). It is therefore the object of the present invention to further improve the above-described method.

The present invention realizes this object by the initially mentioned method, whereby a concentration and/or a density distribution of defects is controlled as a function of at least two process gases that have different compositions and each contain at least one reactive component, and whereby at least two of the process gases, essentially separated from one another, respectively act on at least two different surfaces of the substrate.

With the inventive method, for example the front and rear side of, for example, disk-shaped semiconductors, for example silicon wafers, are brought into contact with different reactive gases. This makes it possible during a thermal treatment of the wafer to control defect distributions and/or defect concentrations from both sides of the wafer, whereby as a result a maximum of possibilities are possible, especially with regard to the concentration and the spatial distribution of defects, but also with regard to the type of defects, for example point defects and/or volume defects. The inventive method can preferably be used in RTP- (Rapid Thermal Processing-), CVD- (Chemical Vapor Deposition-), RTCVD- (Rapid Thermal Chemical Vapor Deposition-) and epitaxial units, in which generally a "single wafer processing" is carried out, i.e. with which respectively only one wafer is subjected to a thermal treatment. However, a plurality of wafers could also be simultaneously subjected to a thermal treatment, as is effected, for example with many epitaxial or CVD units. In such a case, a plurality of wafers (for example two to six) are essentially disposed in a single plane. As a consequence of a thermal treatment of respectively only a single wafer or only few wafers, that are essentially disposed within a plane, there exists the possibility of respectively bringing the wafer or wafers, each with front and back sides, pursuant to the inventive method in contact with essentially only one process gas, whereby the composition of the process gases is different and each includes at least one reactive component.

Pursuant to the present invention, a process gas includes at least one reactive component i.e. a component that reacts with the substrate. The reaction can be a chemical reaction of the component (for example O2) with the substrate (for example Si) to form a new substance (for example Si+O2>SiO2), an adsorption (physical sorption and/or chemical sorption) of a component of the process gas, and etching (chemical reaction) or a desorption of an already present adsorbent by components of the process gas. The reaction can be effected at the substrate surface (for example, beginning of the oxidation of Si, or the oxidation of a copper layer applied to a substrate), on a portion of the substrate surface, or also within the substrate (for example the oxidation of Si of the already present silicon oxide layer). Furthermore, the reaction can also be effected on defects within the substrate, as is the case, for example, with the reduction of SiO2 by hydrogen, whereby the SiO2 is disposed on the inner surfaces of COPs (crystal originated particles). The process gas can include inert gases, i.e. gases that do not react with the wafer or the substrate. Whether a gas or a gas component behaves in an inert fashion can depend upon the process temperature, with an example for this being N2 during the processing of silicon. At temperatures of up to about 1100° C. N2 behaves nearly inert; only at temperatures over 1100° C. does any appreciable action with silicon in the form of a nitridation occur. Other inert gases are, for example, noble gases such as argon, helium, neon. For this connection, helium is characterized, for example, by a particularly high thermal conductivity, which can, for example, be advantageous during the rapid cooling of the substrate.

With the phrase "process gases that are essentially separated from one another" it is to be understood that the process gases taking part in the process at most mix with one another to such an extent that at a surface or in a region of this surface, reactions dominate that are generated by the process gas that predominantly acts upon the surface. Ideally, the process gases would be entirely separated by the substrate, so that a mixing of the process gases in the vicinity of the respective surface is not possible, and each process gas acts only on one surface of the substrate. However, the fulfillment of this ideal condition depends greatly on the technical design of the process chamber and upon the holding device of the substrate. However, the inventive method can also be carried out even if this ideal condition is not completely fulfilled, with one taking care, for example, that the process gases that act upon various surfaces of the substrate mix only minimally with one another, or mix only to such an extent that, as described above, one reaction dominates.

In the following, the term defect is intended to include zero to three-dimensional lattice defects. Zero-dimensional defects are, for example, point imperfections, or point defects such as vacancies, self-interstitial atoms (EZG or interstitials) and chemical foreign atoms that are disposed in the host or matrix lattice on interstitials or lattice locations. Depending upon whether the defects are caused by host lattice atoms or foreign atoms, one speaks of intrinsic or extrinsic point defects. If the host lattice atoms that cause the vacancies wander to the surface, there result Schottky defects; if these atoms wander to interstitial positions, one talks of Frenkel defects. An accumulation (agglomeration) of point defects can lead to higher dimensional disorders, such as, for example, displacement rings or displacement lines (one-dimensional defects), stacking errors (two-dimensional defects), or precipitates of foreign atoms (three-dimensional defects).

Further defects are, for example, grain boundaries (two-dimensional) or the already mentioned three-dimensional precipitates (for example oxygen precipitates in silicon or metal precipitates), or the nucleation centers necessary for the formation of precipitates as well as local amorphous regions that result, for example, during ion implantations or voids. The term crystalline-like should be understood to mean, for example, the transition region from crystalline to amorphous structure. A further defect is also the formation of F-centers (Farnsworth centers), such as are present, for example, in ion crystals, where an electron stops in a halogen gap in the vicinity of the adjacent cations.

Pursuant to one preferred embodiment of the invention, the two different surfaces of the substrate are disposed approximately opposite one another, and the density distributions of the defects produced by the reactive components of the process gases extend from each surface in a direction toward the respective other surface. With this embodiment, involved are in general disk-shaped substrates, for example semiconductor wafers of silicon. In this connection, the front and rear sides of the wafer are respectively brought into contact with the respectively different process gases during a thermal treatment step.

The density distributions of the defects produced by the process gasses are preferably essentially self-interstitial atoms at the one surface and vacancies at the other surface. The density distributions then extend respectively in the direction toward the respective other surface. If the defects, for example with a silicon wafer, on the front side are self-interstitial atoms, i.e. are to result on the side of the structures, or structures are already present, then for example the diffusion of boron present in the silicon is promoted in the direction of the interior of the wafer, or in general, the diffusion of foreign atoms (that use these defects from self-interstitial atoms that fall in the class of inherent point defects as "diffusion vehicles") is promoted in the direction counter to the gradients of the density distribution of the self-interstitial atoms, or is obstructed in the direction of the gradients. The behavior is correspondingly reversed if the defects are vacancies, then the diffusion of foreign atoms in the direction of the gradients of the density distribution of the vacancies is promoted and is obstructed in the direction counter to the gradients of this density distribution. This characteristic can be advantageously exploited with the manufacture of flat zones that are implanted with foreign atoms by generating an excess of vacancies from the surface at which the implanted zones are disposed. On the side of the crystal (generally a wafer) opposite to the implanted zones, an excess of self-interstitial atoms is advantageously produced. The term excess is here understood to mean an exceeding of the defect concentration that would be established in the thermal equilibrium at the respective process temperature. By generating such defect distributions, the diffusion of foreign atoms in the direction of the interior of the crystal is essentially obstructed, as a result of which flat zones of foreign atoms can also be produced after a thermal treatment of the crystal, for example after an activation step. As a result one obtains flat PN junctions, so-called ultra-shallow-junctions.

It can furthermore be advantageous for the density distributions to respectively comprise self-interstitial atoms and vacancies that proceed from the respective surface and that differ in concentration and/or in their ratio relative to one another. Such density distributions, can, for example, be produced by suitable process gases that include not only reactive components for the production of self-interstitial atoms but also reactive components for the production of vacancies. With such process gases it is possible in particular to influence the spatial profile of activated foreign atoms in a crystal lattice, for example silicon.

Furthermore, the different process gases that act, for example, on the front side and the rear side of a wafer, can advantageously have different thermal conductivity coefficients and/or heat-absorption capacities. As a result it is possible, for example, to enhance a varying rapid cooling off or heating up of the wafers at the respective surfaces, as a consequence of which, within the wafer, there is formed from one surface to the other a temperature gradient that, for example, in turn influences the diffusion property of defects.

The present invention is advantageously utilized to process a substrate having a predefined temperature/time profile within a process chamber. As a result of the temperature/time profile, the diffusion property of the defects can be controlled significantly.

Additionally, at least one process gas can be advantageously correlated with the temperature/time profile with regard to its composition and/or its process gas pressure and/or with regard to its process gas temperature. In this connection, for example, the concentration (partial pressure) of the reactive components of a process gas, the total pressure of the process gas, but also the temperature with which the process gas flows into the process chamber and acts upon the substrate, can be correlated with the temperature/time profile.

The inventive method can also be advantageously utilized with an "undoped" silicon wafer, with which is to be understood such wafers that after manufacture of the wafer are not additionally doped with foreign atoms by, for example, diffusion and/or implantation and/or some other process. With such wafers the spatial defect distribution can be adjusted or established that is then used for fixing the oxygen distribution within the silicon crystal. The method can, for example, be advantageously used for establishing the precipitate distribution of oxygen.

The use of the inventive method with "doped" silicon wafers can, as already indicated above, also be advantageous, for example, during the production of flat pn junctions. In this connection, doped wafers means those wafers that are additionally doped with foreign atoms, for example by diffusion and/or implantation and/or some other process. If the inventive method is used, for example, with doped silicon wafers, it is advantageous if certain defects are essentially in a surface layer between 0 and 150 $\mu$m, whereby density, quantity or concentration decrease toward the interior of the substrate. An example of this is vacancies.

If in contrast the inventive method is used for the preparation of silicon wafers, it is advantageous if certain defects are essentially depleted in a surface layer between 0 and 150 $\mu$m, and the defects are essentially disposed in the interior of the substrate. In this case, the defects are, for example, essentially vacancies at which, for example, oxygen precipitates can form. In so doing, there is advantageously produced at the wafer surface a precipitate-free layer of about 150 $\mu$m within which structures, such as, for example, electronic circuits can be produced.

The inventive method can also be used with production wafers, i.e. wafers that already include structures that are obtained during the manufacture of integrated circuits, discrete components, or in general electronic circuits. Furthermore, the wafers or substrates can also include components from the microstructure technology.

In general, as already mentioned above, the defects can be foreign atoms. This is in particular the case with doped crystals. However, the defects can also be vacancies at which is effected, for example, a precipitate formation, so that the defects are, in effect, precipitates.

Furthermore, the defects can also be "crystal originated particles" COPs, which are controlled via the inventive process with regard to their spatial distribution and/or concentration.

Advantageously, the defects generated by at least one process gas can produce a getter layer in a layer in the vicinity of one surface, whereby the getter layer can be used, for example, for the gettering of impurities such as metals. Such a getter layer can, for example, comprise an accumulation of oxygen precipitates in silicon. As described above, such a precipitate layer can, for example, be produced via a suitable spatial vacancy distribution.

By means of the inventive method, defects such as vacancies and/or self-interstitial atoms are produced, whereby the reactive process gas preferably includes oxygen and/or nitrogen and/or an oxygen and or nitrogen-containing component. In this connection, for example one of the process gases can essentially comprise oxygen and/or an oxygen-containing gas, i.e. the fraction of other gases is, for example, less than 100,000 ppm.

For certain processes, it can, however, also be advantageous if one of the process gases is less than 50,000 ppm, preferably less than 1,000 ppm, and with many processes even less than 250 ppm, although more than 10 ppm oxygen (or in general oxygen-containing gas) and/or nitrogen (or in general nitrogen-containing gas).

BRIEF DESCRIPTION OF THE DRAWINGS

The invention will be explained in greater detail with reference to the following figures with the aid of preferred embodiments. The figures show in FIG. 1 a schematic sectional illustration of a process chamber, for example of an RTP system, suitable for carrying out the invention.

DESCRIPTION OF PREFERRED EMBODIMENTS

Figure 1:
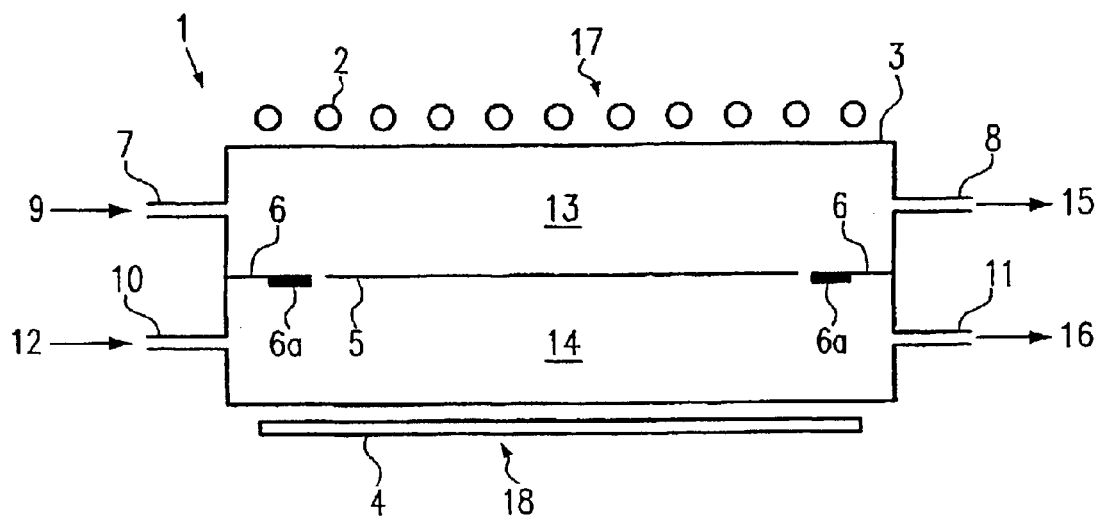

FIG. 1 shows a schematic illustration of a process chamber 3, which is suitable for carrying out the inventive method. This chamber can be the chamber of an RTP-, CVD-, RTCVD-, or epitaxial system 1, within which chamber generally a single wafer 5 (a substrate 5) undergoes a thermal treatment. The wafer or the substrate is, for example, a silicon wafer having a diameter of up to 300 mm, or even greater. In the system 1, the wafer, by means of a heating device 17, 18, for example via lamps 2, 4, preferably, for example, rod-shaped halogen lamps that are disposed in the form of banks of lamps 17, 18, is heated to a temperature between room temperature and approximately 1400° C. (in the case of silicon wafers). Lamps in the form of banks of lamps 17, 18 are preferably disposed outside of the process chamber 3 above and/or below the wafer 5. Where the banks of lamps 17, 18 are disposed on both sides, heating of the wafer 5 via the lamp radiation of the lamps 2 and 4 or the banks of lamps 17, 18 is possible from both sides. In this connection, the lamps 2, 4 of the upper and lower banks of lamps 17, 18 can be disposed parallel to one another, at an angle, or, as illustrated in FIG. 1, at right angles to one another. For the lamp radiation, the process chamber 3 includes transparent regions that, for example, are comprised of quartz, so that the lamp radiation can pass into the interior of the process chamber for heating up the wafer. The entire process chamber can also be formed, for example of quartz.

The lamps 2, 4 of the bank of lamps 17, 18 are advantageously disposed at an angle to one another, preferably at an angle of 90° as illustrated in FIG. 1, whereby each individual lamp can be controlled separately, or the lamp can be controlled in sections in predefined groups.

Systems 1 having heating on one side can also be used, whereby with these systems the chamber wall that is disposed across from the bank of lamps is generally reflective.

The illustrated process chamber is furthermore provided with at least two gas inlet devices 7,10 via which at least two process gases 9,12 can be introduced into partial chambers 13,14 without the process gases 9,12 significantly mixing with one another. Similarly, the chamber 3 is provided with at least two separate gas discharge devices 8,11 via which the respective process gas 15,16 can again escape out of the partial chambers 13 and 14. Ideally, the chamber 3 is configured such that the process gases 9,12 that are flowing in mix with one another to a minimal extent, so that the discharging process gases 8 and 11 contain minimal fractions of the respective other gas or possible reaction products of the respective other gas.

The maximum process temperatures to which the substrate 5 is heated to in the chamber 3 depend upon the type of substrate; a similar situation exists for the process times and the temperature/time profile of the thermal treatment. For silicon wafers in RTP systems, process times between approximately 0 and 500 seconds are used in order to hold the wafer at an approximately constant temperature. The ramp rates for the heating up are approximately 5° C./s to approximately 500° C./s, and for the cooling off approximately up to 150° C./s, whereby, however, with appropriate cooling devices cooling rates in the range of the heating rates can also be achieved. Within the aforementioned ramp rates, temperature ranges, and time periods, a wafer can be heated with modern units, such as the AST 3000, in such a way that the wafer temperature follows nearly every desired temperature/time curve, whereby the temperature distribution over a wafer surface can approach approximately 0.1% to 1.5% of a prescribed temperature curve. Where the wafer is heated on both sides, as is made possible, for example, in FIG. 1 by the banks of lamps 17 and 18 above and below the wafer, temperature differences between the front and back sides of the wafer (upper side and lower side) can also be established, whereby in practice generally the requirements exist for as small a temperature difference as possible between the upper side and the lower side and to realize as uniform a temperature distribution on the wafer as possible.

In order to fulfill the requirements with regard to the spatial and timely temperature distributions that the wafer should experience during the thermal treatment, as mentioned previously the lamps 2,4 of the banks of lamps 17,18 are controllable individually arm groups, so that the radiation field that exists in the process chamber 3, and that is produced by the heating device 17,18, can be controlled not only spatially but also in terms of time.

For carrying out the inventive method, the process chamber 3 is embodied as a two-part chamber having the partial chambers 13 and 14. The partial chambers 13 and 14 are formed by a dividing device 6 and by the wafer 5. In this connection, the dividing device 6 is preferably comprised of a material that is transparent for the lamp radiation and/or wafer radiation, preferably being made of quartz. The quartz-dividing device 6 can include an annular, nontransparent region 6a, so that the wafer is surrounded by this region 6a. This region 6a forms a type of protection (guard ring) about the wafer in order to achieve a more uniform temperature distribution. In this connection, the guard ring 6a can be thinner than, thicker than, or have the same thickness as does the wafer. It can be disposed in the plane of the wafer, somewhat below or somewhat above the wafer, whereby the displacement from the plane of the wafer is generally less than 5% of the wafer diameter, i.e. for a 300 mm wafer the displacement is preferably less than 15 mm.

The wafer 5 is held within the process chamber 3 by a non-illustrated wafer holding device in such a way that together with the dividing device 6, a two-part chamber having the partial chambers 13 and 14 results. A possible gap between the wafer 5 and the dividing device 6 is minimized thereby, yet is large enough that the wafer can undergo a thermal expansion that is imparted by the thermal treatment. If the wafer 5 rests upon the dividing device 6, a gap formation between wafer 5 and dividing device 6 can advantageously be avoided, thereby better separating the partial chambers from one another. If the wafer 5 and dividing device 6 are not disposed in the same plane, a separation of the partial chambers can, for example, also be realized by having the wafer 5 overlap a portion of the dividing device 6, as a result of which an essentially horizontal gap results between the partial chambers 13 and 14. In this connection, the width of the gap is determined by the spacing between the wafer 5 and dividing device 6. This spacing can also be minimized, so that as little gas as possible is exchanged between the partial chambers 13, 14.

Figure 6:
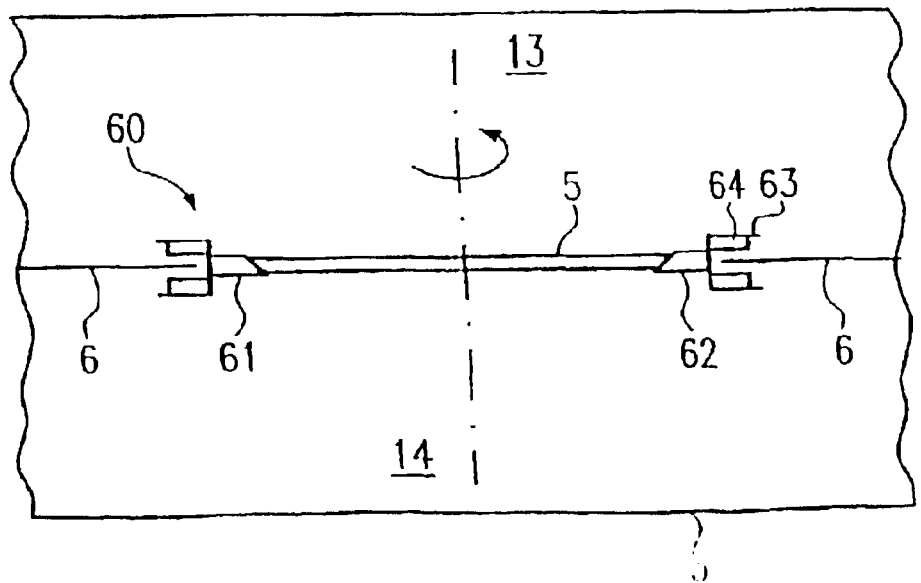
FIG. 6 a portion of a process chamber having a schematic illustration of a rotary device with a dividing device for forming a split process chamber having two partial chambers.

The wafer 5 can furthermore be rotated via a rotary device (not illustrated), whereby the axis of rotation advantageously extends through the center of the wafer and perpendicular to the surface of the wafer. As a consequence of the rotation of the wafer, a more uniform homogeneous temperature distribution can be realized. If the wafer 5 is rotated, the partial chambers 13 and 14 are preferably realized by the above-described, partial overlapping of the dividing device by the wafer or portions of the rotary device. With regard to the latter possibility, FIG. 6 schematically shows a rotary device 60 of one possible embodiment, according to which the wafer 5 is held upon wafer support elements 61 of a rotating ring 62. The periphery of the rotating ring 62 has an outwardly open U-profile 63 into which the dividing device 6 of the process chamber 3 projects at least partially without, however, contacting the leg of the U-profile 63. In so doing, the rotary device 60 overlaps both sides of the dividing device 6, which leads to a good separation of the two partial chambers 13 and 14. The horizontal gap between the U-profile 63 and the dividing device 6 is thereby minimized. In addition, vanes 64 can be mounted on at least one side, advantageously however on both sides, of the flanges of the U-profile 63, so that when the rotary device 60 rotates, these vanes 64, due to the centrifugal forces, produce a pump effect and thus prevent process gas from passing out of one partial chamber into the other. Depending upon the substrate material, the ring 62 is comprised, for example, of quartz or sapphire (for example if the substrate is comprised of sapphire such as, for example, with III-V semiconductors, for example for GaN:Mg), with silicon wafers the ring is advantageously comprised of silicon or coated silicon or silicon carbide (SiC), whereby SiC can also be used for GaN:Mg if SiC is used as the carrier material of the III-V semiconductor. As a result, the wafer can be heated not only from the front side but also from the rear side and from the edge regions. The rotation and/or the position of the rotary device 60 relative to the chamber 3 can be effected mechanically via, for example, a shaft, magnetically, electro-magnetically, or via an air cushion device. Furthermore, suctioning-off devices and/or gas inlet nozzles can be provided in the dividing device, so that, for example, gas that tries to flow from one partial chamber 13, 14 into the respective other chamber can be drawn off. In addition, or alternatively, for example an inert gas can flow in via gas inlet nozzles, so that a type of gas seal results between the partial chambers 13 and 14 in the region of U-profile 63. Under certain conditions, the gas inlet nozzles can also be supplied with a reactive process gas, if, for example, a mixing of the gases in one chamber is permissible yet is impermissible in the other chamber. In this case, the process gas is advantageously used as a gas seal that is found in that chamber that is to be sealed relative to the other chamber.

FIG. 2 illustrates a number of embodiments of the invention, whereby respective process gases having at least one reactive component are used above and below the wafer 5 in the partial chambers 13 and 14.

Figure 2A:
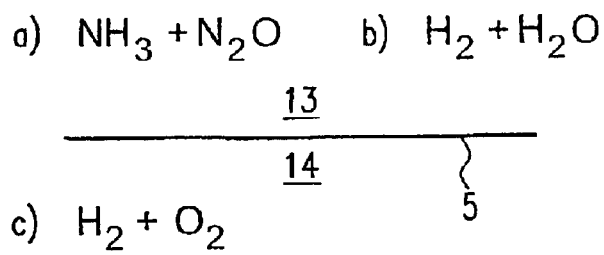
FIG. 2 a) Examples of various process gas mixtures, each having several reactive gases; b) Example of different process gases, each having a single reactive gas.

In this connection, as illustrated by way of example in FIG. 2a, process gases having at least two reactive components can be used in one partial chamber 13, 14, whereby, for example, the nitrogen-containing components, during a thermal treatment of a silicon wafer, produce additional vacancies at the wafer surface that then diffuse into the interior of the wafer. Oxygen-containing components produce additional self-interstitial atoms (EZG) that also diffuse into the interior of the wafer. By suitable combination of oxygen and nitrogen containing gases, the concentration of vacancies and the EZG can thus be set. Since the vacancies and the EZG have different diffusion coefficients in silicon, and also recombine with one another, a desired density distribution (from the surface to the interior of the wafer) of vacancies and/or EZG can additionally be set. In this connection, not only the temperature, the temperature profile in terms of time, the process time and the composition of the gas mixture can be utilized for setting the concentration and the density distribution of the defects.

With the density distribution of the defects, however, a distribution of activated foreign atoms (donators or acceptors) are also determined therewith. Due to the thermal treatment, the activation of implanted silicon wafers, the spatial distribution profile of the doped or implanted-in foreign atoms naturally expands due to diffusion. However, due to the possibility of the activation, i.e. due to the possibility that a foreign atom can reach a lattice location of the silicon, this diffusion is essentially also determined by the concentration and the spatial distribution (density distribution) of the defects. This is so because the defects significantly influence the activation probability, i.e. the probability that a foreign atom can reach a lattice location of the silicon.

Such a manipulation of the spatial distribution of the activated foreign atoms via the use of RTP in an undivided process chamber, i.e. in a process chamber in which the wafer is surrounded on all sides by the same process gas, is described, for example, in the not-pre-published German patent application 199 27 962 of the same applicant.

The process combination of a) ($NH_3+N_2O$) and c) ($H_2+O_2$) illustrated in FIG. 2a is used, for example, for the manufacture of flat pn junctions (so-called "ultra-shallow-junctions"). In this connection, the concentrations of $NH_3$ are approximately 5 ppm to 50,000 ppm, the concentration of $N_2O$ is in the range of 0% to 100% (deducting the $NH_3$ concentration). Furthermore, the two reactive gases can also be diluted with an inert gas such as, for example, argon. Alternatively, instead of the process gas c), a mixture of, for example, ($N_2+O_2$) can be used, whereby the $O_2$ concentration is in the range of 10 ppm to 50,000 ppm. This gas mixture can also be diluted with an inert gas such as argon, or the nitrogen can be replaced by an inert gas. If in a process gas mixture hydrogen $H_2$ and an oxygen-containing gas are used, the hydrogen concentration is preferably selected in a range beyond the explosion threshold, in the event that an explosion is possible. If the oxygen-containing gas is $H_2O$ as, for example, in Example b) in FIG. 2a, there results no danger of explosion and any desired mixture can be selected, for example from the sub ppm range up to 100% of the respective gases. The gas mixture c) ($H_2+O_2$) can be selected, for example, such that at atmospheric pressure initially at the hot substrate surfaces and/or in the vicinity thereof a combustion of oxygen and hydrogen to form water is effected. This water then serves, for example, for the oxidation of the substrate surface.

Figure 2B:
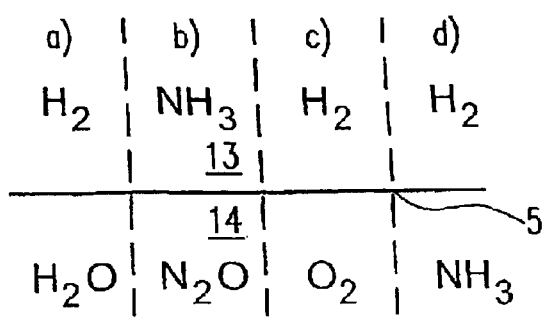

FIG. 2b shows four Examples a) to d) with which at least two reactive gases act upon respectively different surfaces of the substrate. In Example a) the $H_2$ concentration and the $H_2O$ concentration are in the range of about 1 ppm to 100% (for example diluted by inert gases such as argon or at temperatures under approximately 1100° C. also $N_2$). At temperatures over 1100° C., during the processing of silicon molecular nitrogen is also converted to a nitrogen containing reactive gas, since then at the Si surface and/or an $SiO_2$ surface a nitridation is effected, as a result of which defects in the form of vacancies result. In general, an initially (i.e. at low temperatures) inert gas can behave increasingly reactively after exceeding a threshold temperature of the substrate. Such gases should also be considered as reactive gases within the framework of the present invention if the substrate temperature exceeds the threshold temperature during the thermal treatment. In this way, a number of variations of the present invention are possible.

Thus, for example, from the Example a) of FIG. 2b initially the water (more precisely water vapor) that acts, for example, essentially upon the underside of the silicon wafer 5 can be diluted with $N_2$, for example an $N_2$ concentration of about 1 ppm to about 100,000 ppm. After the wafer has been heated up, the water has an oxidizing effect, i.e. additional self-interstitial atoms result upon the back side of the wafer. If the threshold temperature of about 1100° C. is exceeded, the molecular nitrogen additionally acts in a nitriding manner and additional vacancies are produced. These however only during the time period of exceeding the threshold temperature. In this way a further possibility for controlling the defect distribution is presented.

The Examples a) and c) illustrated in FIG. 2b, according to which above an Si wafer hydrogen (in the concentration range between 1 ppm and 100%) is used, and below the wafer water or oxygen (respectively in the concentration range between 1 ppm and 100%) are used as reactive gases, can be used, for example, in order to reduce the COP density on the upper side of the wafer, because the hydrogen reduces the $SiO_2$ within the COPs, as a result of which these can be eliminated by accumulation of interstitial Si atoms. In addition, interstitial Si is produced on the back side of the wafer by means of the oxidation, with the Si diffusing in the direction of the upper side of the wafer.

If on the back side of the wafer, for example $N_2O$ (in the concentration range 1 ppm to 100%) is used, and on the upper side of the wafer $NH_3$ (in the concentration range 10 ppm to 100,000 ppm) is used (as illustrated in FIG. 2b in Example b)), then in a region of an upper side vacancies and in the region of the underside EZG are produced.

In the Example d) in FIG. 2b, above the wafer hydrogen $H_2$ (possibly diluted with an inert gas such as Ar or $N_2$) having a concentration of 1 ppm to 100% is used, while below the wafer ammonia $NH_3$ is used (possibly diluted with an inert gas such as Ar or $N_2$). In this case, for example in a region of the upper surface of the wafer, COPs are reduced, and in the region of the lower surface of the wafer vacancies are produced that can serve, for example, for the formation of getter centers.

The gases or gas combinations of the previously described embodiments can generally be combined with one another in any desired fashion. Furthermore, gases or gas combinations can be replaced by equivalently working ones.

Figure 3:
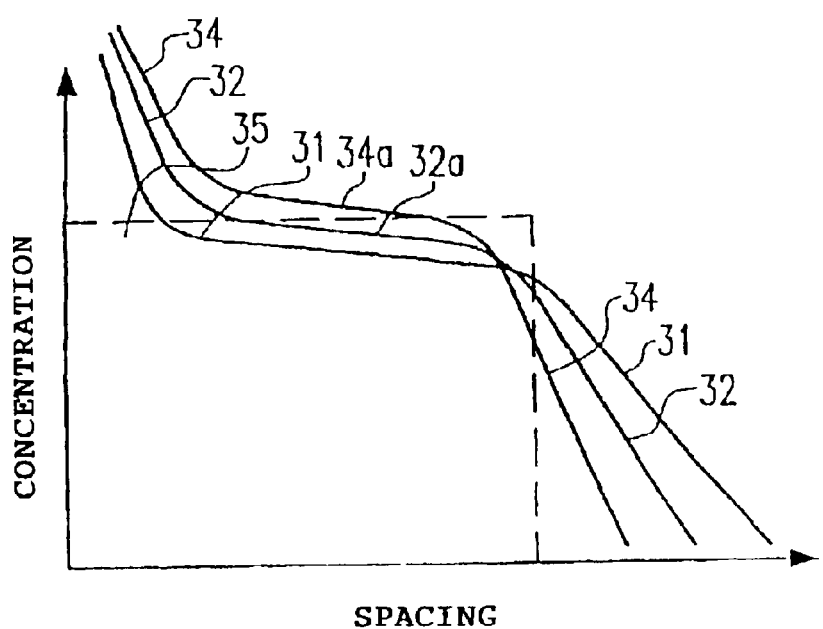
FIG. 3 schematic concentration distributions of implanted foreign atoms after the thermal activation using different process gases.

FIG. 3 schematically shows the one-dimensional distribution of activated foreign atoms as a function of the spacing from the wafer surface. In this connection, curve 31 shows a conventional activation with which an inert gas or merely one reactive gas is used for the manipulation of the defect distribution within the wafer. With this conventional activation method, at most one type of defect (vacancies or EZG defects) is influenced by the process gas, as this is described, for example, in D. F. Downey et al.; Mat. Res. Soc. Symp. Proc. (1997), Vol 470, pp. 299–311.

At the same thermal budget, the distribution of the activated foreign atoms can be considerably less if one utilizes the method described above in the German patent application 199 27 962. This is schematically represented by the curve 32. In addition, the concentration of the activated foreign atoms can be increased, which is also shown in the increase of the plateau region 32a, so that the distribution of the activated foreign atoms more closely approaches a desired "box profile" 35. This is in particular necessary with very highly integrated circuits, since there very thin activated zones are necessary, and hence a "box profile" 35 should be realized as closely as possible.

Figure 4:
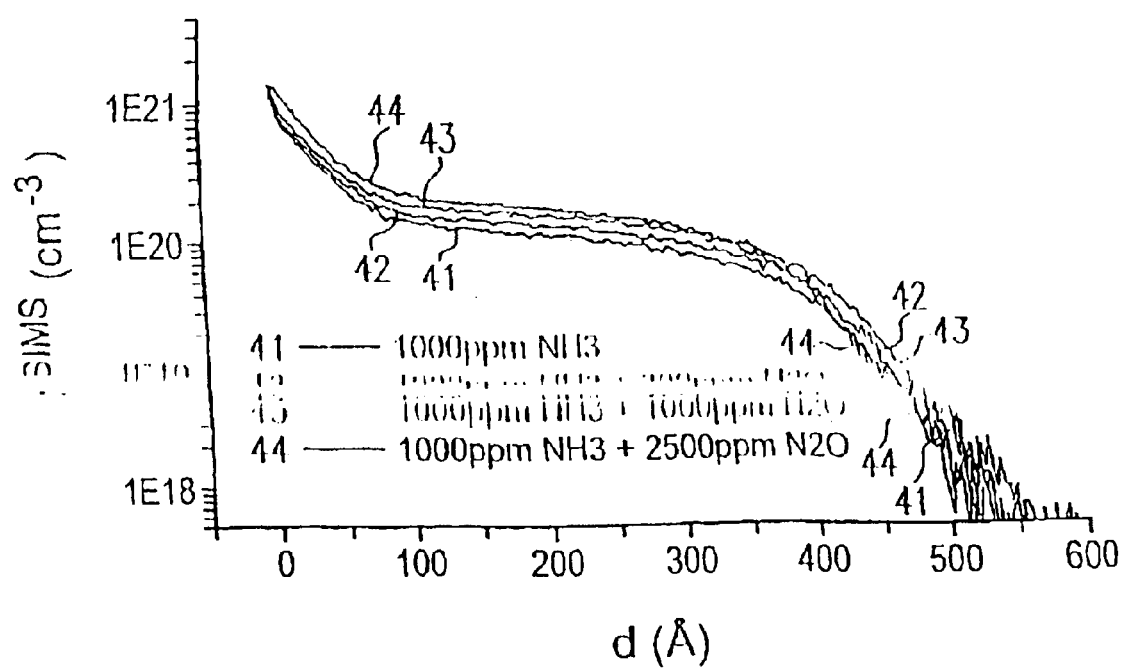
FIG. 4 measured concentration distributions of implanted foreign atoms (As) after the thermal activation using different process gases.

FIG. 4 shows several measured activation distributions in the form of the densities of the activated foreign atoms (in 1/ccm) as a function of the spacing from the silicon wafer surface (in angstroms) for arsenic, which were produced according to the method pursuant to the German patent application 199 27 962. It is clearly recognizable that due to the combination of two reactive gases (here NH3 and N2O) that respectively produce vacancies and EZG, an increase of the plateau 32a (see also FIG. 3) can be achieved (compare curve 41 with 42 to 44), and that in addition by the suitable selection of the composition of the reactive gases (here NH3 and N2O) the width of the density distribution can be minimized (compare curve 44 with, for example, 41). In so doing it is clearly easier to fulfill the requirements of the "box profile" 35 of as high an activation concentration as possible with as small a distribution as possible. A noble or inert gas such as argon, or however, also molecular nitrogen N2, can, for example, serve as a carrier gas of the reactive gases.

Pursuant to the present invention, the method illustrated up to now with the aid of FIG. 3 and FIG. 4 can now be further improved in that, as illustrated in FIG. 2a, one uses respectively different process gases above and below the wafer in the partial chambers 13 and 14. Thus, for example, gas combinations a) and c), as illustrated in FIG. 2a, can be combined with one another, whereby the respective concentration ratios relative to one another or in an inert carrier gas are adapted to the requirements. With the combination a) and c), additional EZG can be produced, for example at the back side of the wafer, which very rapidly diffuses in the direction of the front side of the wafer (upon which the structures, for example MOS transistors, that are to be produced are disposed). If arsenic is implanted, for example, on the front side of the wafer, the diffusion of arsenic into the interior of the wafer can additionally be prevented. A further approximation of the desired box profile 35 is the result, and this is shown in FIG. 3 at 34, 34a. With a suitable concentration of oxygen and hydrogen, in addition an in-situ wet oxidation can result upon the back side of the wafer, or the hydrogen can be used for reduction reactions or for the saturation of dangling bonds.

As an alternative to the processes illustrated in FIG. 2a, where in each partial chamber 13, 14 at least two or more reactive gases (and possibly inert carrier gases) are disposed, it is possible as illustrated by way of example in FIG. 2b to dispose in each partial chamber 13, 14 only one reactive gas (and possibly inert carrier gases). A number of examples are provided in a), b), c), and d), and were already discussed above. Here also the defect/density distributions of the front side of the wafer and of the back side of the wafer can be controlled by the influence of the reactive gases. Furthermore, a combination of the methods described in FIGS. 2a and 2b are also possible, according to which in one partial chamber only one reactive gas (possibly with one or more inert carrier gases) is present, and in the other partial chamber two or more reactive gases (possibly with inert carrier gases) are present.

The previous combinations, and the gases and gas combinations illustrated in FIG. 2, are merely provided as examples. In general, it is possible to utilize more than two reactive gases in a partial chamber 13, 14 of the process chamber 3.

The inventive method was previously described in conjunction with the activation of foreign atoms doped in silicon with the aid of FIGS. 3 and 4. Further application possibilities of the present invention are illustrated subsequently.

Figure 5:
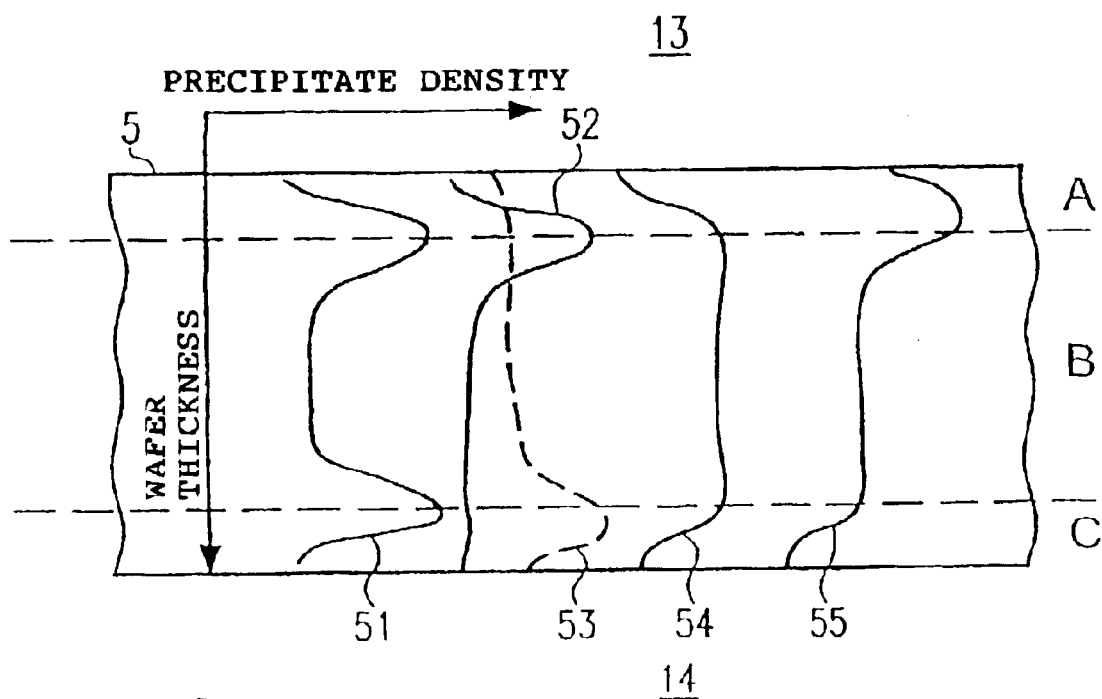
FIG. 5 schematic illustrations of precipitate density distributions or vacancy density distributions in a wafer along the thickness of the wafer.

FIG. 5 schematically shows different spatial distributions of precipitates (for example oxygen precipitates in silicon) along the wafer thickness. The distribution 51 results when the same process gas is used on both sides of the wafer 5. In this connection, the type of distribution, especially the shape of the maxima and the drop off of the distribution toward the rim of the wafer, essentially depends upon the temperature/time curve of the thermal treatment of the wafer 5. In general, the wafer is processed in an undoped state in a process gas that contains nitrogen, whereby a nitrogen-containing gas acts as a reactive gas and generates vacancies at the wafer surface. These vacancies form nucleation seeds for the oxygen precipitation, which is generally effected in a later thermal treatment step.

The greatly unsymmetrical distributions 52 and 53 can, for example, be produced by different process gases in the partial chambers 13, 14, whereby the inventive method can be utilized. For example, if one uses an inert gas such as argon in one partial chamber 14, to which is added oxygen or an oxygen-containing gas only in the range between 10 ppm and 5000 ppm, in order essentially to avoid en etching of the wafer 5 on this side, and in order to obtain a reduction of vacancies by additional production of self-interstitial atoms (curve 52). In contrast, in the other partial chamber 13 a nitrogen-containing gas such as NH3 is used in order to obtain essentially a vacancy injection at the wafer surface. Small quantities of additionally added oxygen prevent an etching of the silicon. One thereby obtains a vacancy distribution that essentially has a maximum in the vicinity of a wafer surface. This surface is used then for the back side of the wafer, since at that location the density of the later resulting oxygen precipitates is the greatest. The oxygen precipitates can then act as getters for, for example, heavy metals such as Cr, Ni, Cu, Fe or other impurities that are found in the silicon or in the process chamber. The structures, for example circuits, are then applied to the precipitate-depleted side. Since here oxygen precipitates would adversely affect the electrical characteristics, such as, for example, the breakdown voltage and the long-term properties, of electronic components, an as low as possible precipitation of oxygen is desired in a surface region of up to 150 $\mu$m. It can be particularly advantageous if the precipitate density rises greatly directly after an extensively precipitate-free surface layer. In so doing, one obtains a getter effect in the immediate vicinity of the electronic structures (for example MOS transistors), which advantageously further improves the electrical characteristics of the structures. One then speaks of "intrinsic getters". Such a precipitate structure is schematically represented, for example, in curve 54. Here the precipitate density drops off greatly at least to one side, whereas it is otherwise very high in order to provide a getter effect. In this connection the precipitate density on one wafer surface even increases additionally, as is schematically shown in curve 55. The structures are then applied to the precipitate-depleted side. If, pursuant to the present invention different process gases are disposed in the partial chambers 13, 14 during the thermal treatment, the steepness or profile of the depleted zones can be controlled on both sides, so that different profiles result in the regions A and C, whereby in the vicinity of at least one surface the concentration of the precipitates is considerably less than in a central region B of the wafer.

A further application possibility of the inventive method is a reduction of the density of COPs. COPs also have a disruptive effect during the production of semiconductor components and integrated circuits, since these COPs, if they are disposed in the surface layer in which the components result, can adversely affect the operation of the latter. COPs can be chemically reduced, for example, by a thermal treatment of the wafer at temperatures over about 1100° C. (preferably over 1150° C.) in a hydrogen-containing gas atmosphere, whereby the $SiO_2$ found within the COPs is reduced. By, for example, oxygen-containing gas (for example $O_2$ and/or $H_2O$) in small quantities (up to 0.1%) additional interstitial atoms can be produced at the wafer surface that then recombine within the COPs on lattice positions. In so doing, the magnitude of the COPs is reduced, or the COPs are eliminated. By a suitable process sequence, the COPs at the surface layers can be reduced, whereby similar to the situation with the precipitates, a spatial COP profile can also be established. Pursuant to the inventive method, a COP depleted can be generated, for example, on the front side of the wafer, and on the back side of the wafer vacancies can be generated, for example via nitrogen-containing gases, with such vacancies being used for the formation of a getter layer, as is schematically indicated in FIG. 2b in Example d).

The inventive method was described with the aid of the above embodiments, control of point defect profiles and hence also control of foreign atom profiles, for example for the manufacture of "ultra shallow junctions" (flat pn junctions), control of oxygen precipitates and of COPs (crystal originated particles) relative to concentration and distribution in, for example, silicon. The inventive method is not limited to these examples and can also be utilized with other semiconductors, for example with semiconductors of the classes III-V or II-VI, as well as other crystalline substances such as, for example, ion crystals. In particular, for the expansion of the application range of the present invention, the features presented within the framework of the embodiments can also be combined with one another.

The specification incorporates by reference the disclosure of German priority document 10024710.5 filed 18, May 2000 and International priority document PCT/EP01/05537 filed 16 May 2001.

The present invention is, of course, in no way restricted to the specific disclosure of the specification and drawings, but also encompasses any modifications within the scope of the appended claims.

What is claimed is:

1. A method for producing defect profiles in crystalline crystalline or crystalline-like structure of a substrate during a thermal treatment in a process chamber, said method including the step of:

controlling at least one of a concentration and a density distribution of defects as a function of at least two process gases that have different compositions and each contain at least one reactive component, wherein at least two of the process gases are essentially separated from one another and act on different surfaces of the substrate, wherein said different surfaces of the substrate are disposed approximately opposite one another, density distributions of said defects produced by the reactive components of said process gases extend from each surface in a direction toward the respectively other surface, and the density distributions respectively comprise essentially self-interstitial atoms, proceeding from one surface, and essentially vacancies proceeding from the other surface.

2. A method according to claim 1, wherein said atoms and vacancies differ from one another in at least one of concentration and ratios.

3. A method according to claim 1, wherein said different process gases have at least one of different thermal conductivity coefficients and heat capacities.

4. A method according to claim 1, wherein the substrate is processed with a predefined temperature/time profile within the process chamber.

5. A method according to claim 4, wherein at least one process gas is controlled in correlation with the temperature/time profile with regard to at least one of composition, process gas pressure and process gas temperature.

6. A method according to claim 1, wherein said substrate is an undoped or a doped silicon wafer.

7. A method according to claim 1 wherein the substrate is a production wafer.

8. A method according to claim 1, wherein the defects are essentially disposed in a surface layer between 0 and 150 μm, and wherein the defects decrease in a direction toward an interior of the substrate.

9. A method according to claim 1, wherein the defects are essentially depleted in a surface layer between 0 and 150 μm, and wherein the defects are disposed essentially in an interior of the substrate.

10. A method according to claim 1, wherein the vacancies are COPs.

11. A method according to claim 1, wherein the defects are generated by at least one of the process gases and produce a getter layer in the vicinity of one of the surfaces of the substrate.

12. A method according to claim 11, wherein said getter layer is essentially formed by oxygen precipitates.

13. A method according to claim 9, wherein one of said process gases is comprised essentially of at least one of oxygen and oxygen-containing gases.

14. A method according to claim 1, wherein one of said process gases contains less than 1000 ppm of oxygen or an oxygen-containing gas.

15. A method according to claim 14, wherein said one process gas contains between 30 and 250 ppm of oxygen or an oxygen-containing gas.

16. A method according to claim 1, wherein at least one of the process gases contains $O_2$, $O_3$, $H_2O$, $NH_3$, $H_2$, a noble gas or an inert gas.

17. A method for producing defect profiles in a crystalline or crystalline-like structure of a substrate during a thermal treatment in a process chamber, said method including the step of:

controlling at least one of a concentration and a density distribution of defects as a function of at least two process gases that have different compositions and each contain at least one reactive component, wherein at least two of the process gases are essentially separated from one another and act on different surfaces of the substrate; and generating the defects by at least one of the process gases and produce a getter layer in the vicinity of one of the surfaces of the substrate.

18. A method according to claim 17, wherein said getter layer is essentially formed by oxygen precipitates.

19. A method according to claim 17, wherein one of said process gases is comprised essentially of at least one of oxygen and oxygen-containing gases.

20. A method according to claim 17, wherein one of said process gases contains less than 1000 ppm of oxygen or an oxygen-containing gas.

21. A method according to claim 20, wherein said one process gas contains between 30 and 250 ppm of oxygen or an oxygen-containing gas.

22. A method according to claim 17, wherein at least one of the process gases contains $O_2$, $O_3$, $H_2O$, $NH_3$, $H_2$, a noble gas or an inert gas.

23. A method according to claim 17, wherein said different surfaces of the substrate are disposed approximately opposite one another and density distributions of said defects produced by the reactive components of said process gases extend from each surface in a direction toward the respectively other surface.

24. A method according to claim 17, wherein density distributions of said defects produced by the reactive components of said process gases comprise essentially self-interstitial atoms, proceeding from one surface, and essentially vacancies proceeding from the other surface.

25. A method according to claim 17, wherein density distributions of said defects produced by the reactive components of said process gases respectively comprise essentially self-interstitial atoms and vacancies proceeding from the respective surfaces, and said atoms and vacancies differ from one another in at least one of concentration and ratios.

26. A method according to claim 17, wherein said different process gases have at least one of different thermal conductivity coefficients and heat capacities.

27. A method according to claim 17, wherein the substrate is processed with a predefined temperature/time profile within the process chamber.

28. A method according to claim 27, wherein at least one process as is controlled in correlation with the temperature/time profile with regard to at least one of composition, process gas pressure and process gas temperature.

29. A method according to claim 17, wherein said substrate is an undoped or a doped silicon wafer.

30. A method according to claim 17 wherein the substrate is a production wafer.

31. A method according to claim 17, wherein the defects are essentially disposed in a surface layer between 0 and 150 $\mu$m, and wherein the defects decrease in a direction toward an interior of the substrate.

32. A method according to claim 17, wherein the defects are essentially depleted in a surface layer between 0 and 150 $\mu$m, and wherein the defects are disposed essentially in an interior of the substrate.

33. A method according to claim 31, wherein the defects are foreign atoms.

34. A method according to claim 32, wherein the defects are at least one of precipitates and vacancies.

35. A method according to claim 32, wherein the vacancies are COPs.

36. A method for producing defect profiles in a crystalline or crystalline-like structure of a substrate during a thermal treatment in a process chamber, said method including the step of:

controlling at least one of a concentration and a density distribution of defects as a function of at least two process gases that have different compositions and each contain at least one reactive component, wherein at least two of the process gases are essentially separated from one another and act on different surfaces of the substrate, wherein the defects are essentially disposed in a surface layer between 0 and 150 $\mu$m, and wherein the defects decrease in a direction toward an interior of the substrate.

37. A method according to claim 36, wherein said different surfaces of the substrate are disposed approximately opposite one another and density distributions of said defects produced by the reactive components of said process gases extend from each surface in a direction toward the respectively other surface.

38. A method according to claim 37, wherein density distributions of said defects produced by the reactive components of said process gases comprise essentially self-interstitial atoms, proceeding from one surface, and essentially vacancies proceeding from the other surface.

39. A method according to claim 37, wherein density distributions of said defects produced by the reactive components of said process gases respectively comprise essentially self-interstitial atoms and vacancies proceeding from the respective surfaces, and said atoms and vacancies differ from one another in at least one of concentration and ratios.

40. A method according to claim 36, wherein said different process gases have at least one of different thermal conductivity coefficients and heat capacities.

41. A method according to claim 36, wherein the substrate is processed with a predefined temperature/time profile within the process chamber.

42. A method according to claim 36, wherein at least one process as is controlled in correlation with the temperature/time profile with regard to at least one of composition, process gas pressure and process gas temperature.

43. A method according to claim 36, wherein said substrate is an undoped or a doped silicon wafer.

44. A method according to claim 36 wherein the substrate is a production wafer.

45. A method according to claim 36, wherein the defects are essentially depleted in a surface layer between 0 and 150 $\mu$m, and wherein the defects are disposed essentially in an interior of the substrate.

46. A method according to claim 36, wherein the defects are foreign atoms.

47. A method according to claim 45, wherein the defects are at least one of precipitates and vacancies.

48. A method according to claim 45, wherein the vacancies are COPs.

49. A method according to claim 36, wherein the defects are generated by at least one of the process gases and produce a getter layer in the vicinity of one of the surfaces of the substrate.

50. A method according to claim 48, wherein said getter layer is essentially formed by oxygen precipitates.

51. A method according to claim 45, wherein one of said process gases is comprised essentially of at least one of oxygen and oxygen-containing gases.

52. A method according to claim 36, wherein one of said process gases contains less than 1000 ppm of oxygen or an oxygen-containing gas.

53. A method according to claim 51, wherein said one process gas contains between 30 and 250 ppm of oxygen or an oxygen-containing gas.

54. A method according to claim 36, wherein at least one of the process gases contains $O_2$, $O_3$, $H_2O$, $NH_3$, $H_2$, a noble gas or an inert gas.

* * * * *

UNITED STATES PATENT AND TRADEMARK OFFICE
CERTIFICATE OF CORRECTION

PATENT NO.   : 6,809,011 B2
DATED        : October 26, 2004
INVENTOR(S)  : Lerch et al.

It is certified that error appears in the above-identified patent and that said Letters Patent is hereby corrected as shown below:

Title page,
Item [54], should read as follows:
-- [54] Title:   ADJUSTMENT OF DEFECT PROFILES IN CRYSTAL OR CRYSTALLINE-LIKE STRUCTURES --

Signed and Sealed this

Eighth Day of February, 2005

JON W. DUDAS
*Director of the United States Patent and Trademark Office*